(12) United States Patent
Jean

(10) Patent No.: US 10,181,351 B1
(45) Date of Patent: Jan. 15, 2019

(54) INCREASED NAND PERFORMANCE UNDER HIGH THERMAL CONDITIONS

(71) Applicant: Micron Technology, Inc., Boise, ID (US)

(72) Inventor: Sebastien Andre Jean, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/690,708

(22) Filed: Aug. 30, 2017

(51) Int. Cl.
| | |
|---|---|
| G11C 16/22 | (2006.01) |
| G11C 16/04 | (2006.01) |
| G11C 16/26 | (2006.01) |

(52) U.S. Cl.
CPC .......... *G11C 16/22* (2013.01); *G11C 16/04* (2013.01); *G11C 16/26* (2013.01)

(58) Field of Classification Search
CPC .......... G11C 16/22; G11C 16/04; G11C 16/26

USPC .................................................. 365/185.17
See application file for complete search history.

(56) References Cited

U.S. PATENT DOCUMENTS

| | | | |
|---|---|---|---|
| 9,405,356 B1* | 8/2016 | Sareen | G06F 1/3268 |
| 9,811,267 B1* | 11/2017 | Yang | G06F 3/061 |
| 2016/0170641 A1* | 6/2016 | Pelster | G06F 11/3034 |
| | | | 711/103 |
| 2017/0255403 A1* | 9/2017 | Sharon | G06F 3/0619 |
| 2018/0024777 A1* | 1/2018 | Higgins | G06F 3/0659 |

\* cited by examiner

*Primary Examiner* — Fernando Hidalgo
(74) *Attorney, Agent, or Firm* — Schwegman Lundberg & Woessner, P.A.

(57) ABSTRACT

Devices and techniques for increased NAND performance under high thermal conditions are disclosed herein. An indicator of a high-temperature thermal condition for a NAND device may be obtained. A workload of the NAND device may be measured in response to the high-temperature thermal condition. Operation of the NAND device may then be modified based on the workload and the high-temperature thermal condition.

30 Claims, 7 Drawing Sheets

INCREASED NAND PERFORMANCE UNDER HIGH THERMAL CONDITIONS

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
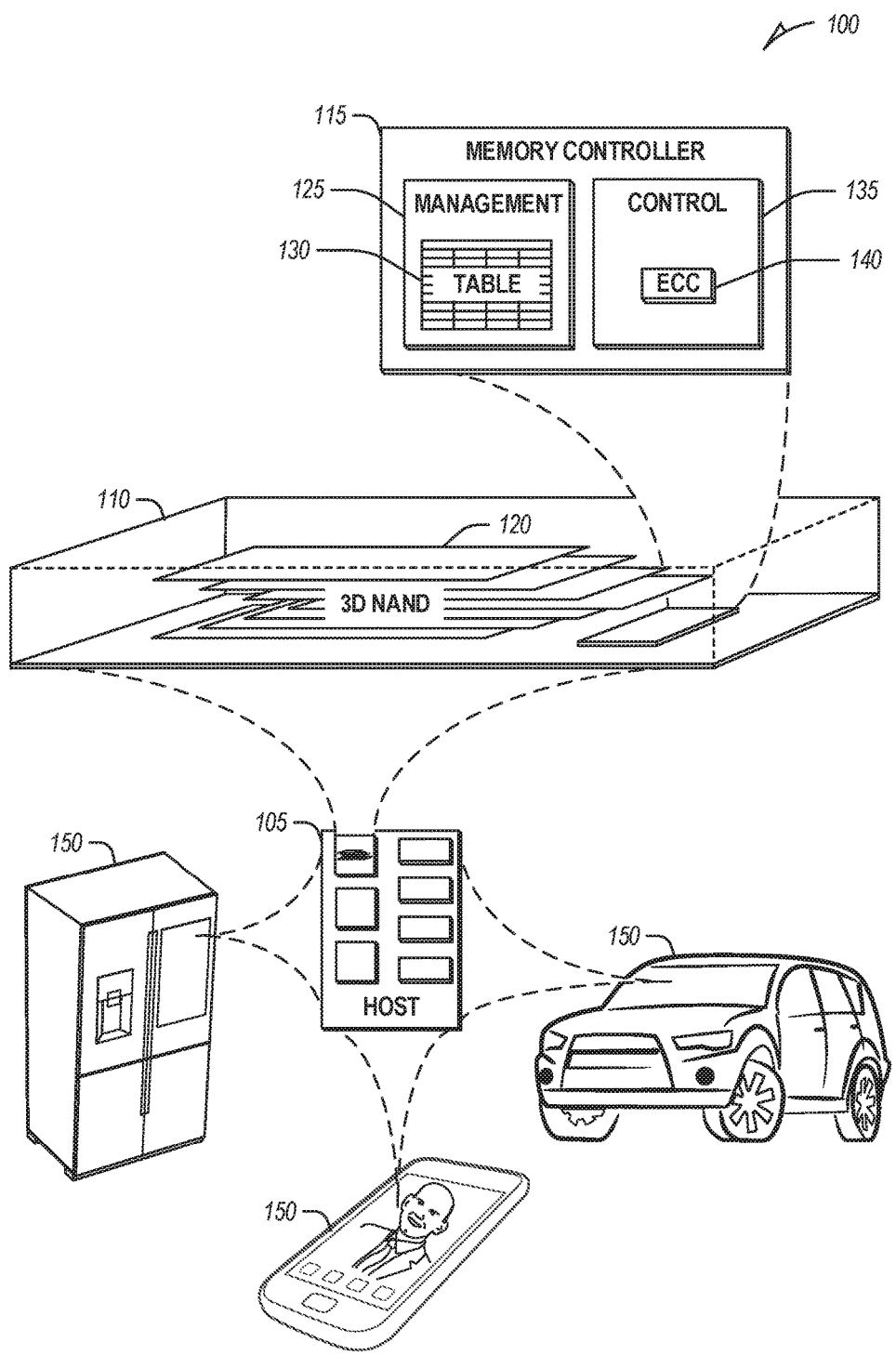
FIG. 1 illustrates an example of an environment including a memory device.

NAND flash relies on accurate voltage levels on a charge trap or floating gate to determine data stored on a cell. The operating temperature of a device may affect trapped charge distributions on cells. Generally, a very hot device results in greater charge trapping and dissipation while a cold device has the opposite effect. Thus, cell charge levels under adverse temperature conditions may result in increased data errors.

A technique to address the temperature dependent integrity of NAND flash devices includes monitoring the device's temperature and mitigating, for example, high temperatures by disabling portions of the device. For example, given an eight die quad plane device, the number of active die may be reduced (e.g., stepped down) to consume less power and generate less heat. Thus, the eight die device may be reduced to four die, two die, etc. While this reduces heat, and may correct the adverse thermal condition, it results in a loss of storage capacity or throughput.

To address the issues noted above, a thermal impact of a device workload can be assessed with respect to an adverse thermal condition. User oriented devices (e.g., devices that primarily respond to user stimuli such as mobile phones, tablets, etc.) often exhibit burst-oriented (e.g., bursty) workloads. Devices generally track active and idle states. An active state may involve a foreground process to fulfill a user request or service. Idle states generally entail modifying operating parameters of the device components to conserve power because there is no current, or pressing, user request or service to fulfill. Often, a device in an idle state is moved to an active state based on a trigger, such as a user actuating a button on a mobile phone, or a network communication arriving. When switching to the active state, device components are brought from a low-power state to a high-performance state to responsively fulfill the user's request. A typical use case involves users invoking a command or function to produce an immediate result which is then consumed by the user. This consumption period is often a nearly idle period for the device. Examples may include loading content, such as an image, or web page, or taking a picture. Thus, a device may be brought into a fully active state only to consume excess power while not adding anything to the user experience. This is the bursty nature of user device workloads; the time-averaged workload generated from the request is small given the predominately idle nature of these devices.

In the user device context, or any device that exhibits a bursty workload profile (e.g., many devices in automotive or industrial applications), the thermal impact of a workload is often small. Thus, reducing active device components does not tend to improve an adverse thermal condition but may impact device performance. To address these issues, the workloads are assessed in conjunction with the adverse thermal condition to modifying operating parameters of the NAND flash device. In an example, this modification is to change a high-temperature policy to disable components (e.g., planes, die, etc.) or throttle throughput (e.g., increase the time between request executions) under a high-temperature thermal condition such that these components are not disabled, or throughput throttling, if the device workload is under a threshold.

The workload can be measured from a command queue. This may be managed by a host or a controller (e.g., packaged with the NAND flash components) of the device. The command queue is a buffer to store commands prior to execution. Generally, commands come in to the queue with timestamp or sequence number (e.g., free running counter). The command queue can be measured by rate (e.g., the number of commands per second), type of commands (e.g., some commands have a higher energy budget), or correction cycles (e.g., a feedback to track how much energy vs. the budget was used when a command was executed). Thus, the energy budget or use is tracked over time to ascertain whether a given workload is a burst (e.g., temporary) or sustained change in activity for the device. In an example, the workload measurement only operates during high-temperature thermal condition.

By combining workload analysis with temperature monitoring, NAND flash devices can operate more safely and at higher performance than current devices permit. Additional details and examples are provided below.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 700 of FIG. 7.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
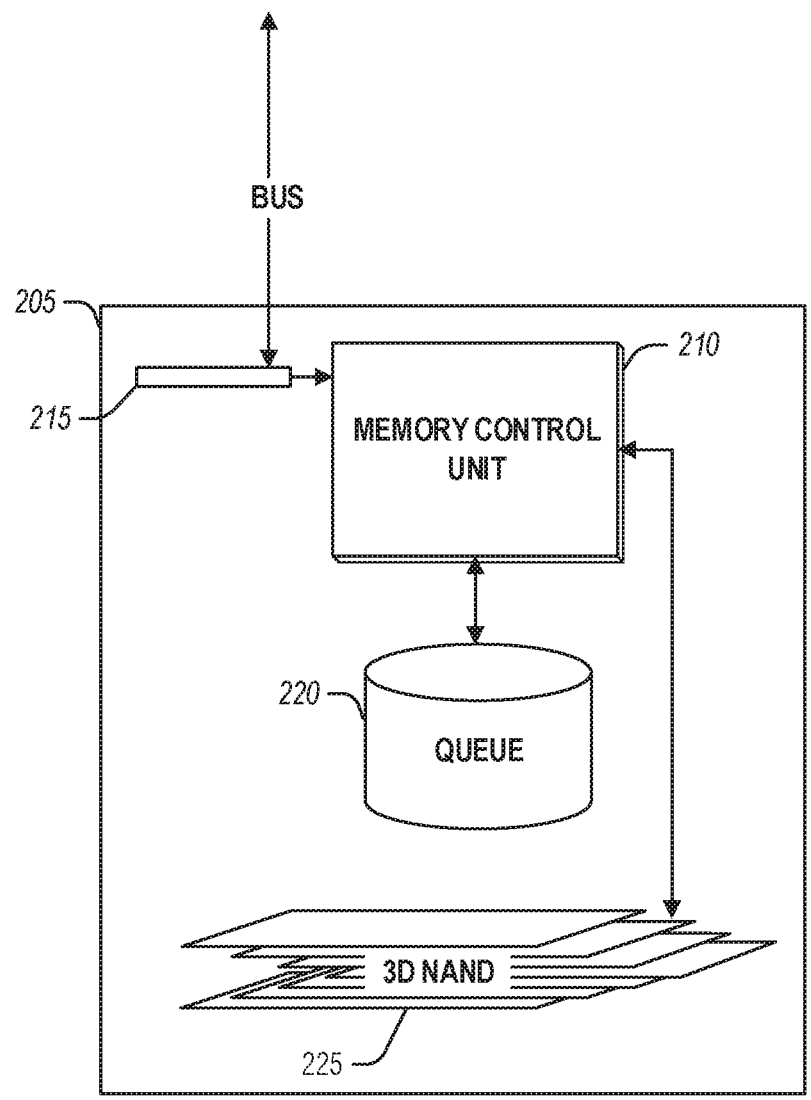
FIG. 2 illustrates an example block diagram of a device for increased NAND performance under high-thermal conditions.

FIG. 2 illustrates an example block diagram of a device 205 for increased NAND performance under high-thermal conditions. The device 205 includes a bus interface 215, a memory control unit 210 (e.g., controller) a command queue 220 and a NAND flash array 225 (e.g., NAND array).

The controller 210 is arranged to obtain (e.g., receive or retrieve) an indicator of a high-temperature thermal condition for the device 205. In an example, the high-temperature thermal condition pertains to the NAND array 225, or a component within the NAND array 225, such as a die, plane, etc. In an example, the high-temperature thermal condition is a temperature reading that is above a threshold. In an example, the high-temperature thermal condition is a signal that another component has generated in response to the temperature rising above a threshold. For example, a die sensor of the NAND array 225 may measure a temperature above the threshold and send an interrupt to the controller 210.

The controller 210 is arranged to measure a workload of the device 205 in response to the high-temperature thermal condition. In an example, measuring the workload includes periodically evaluating the workload during the high-temperature thermal condition. Thus, an ongoing assessment of the workload may continue as long as the device 205 is in the high-temperature thermal condition.

In an example, measuring the workload includes measuring the command queue 220. In an example, measuring the command queue 220 includes measuring a rate of commands over time. The command rate is often useful to ascertain how burst like a given set of instructions are.

In an example, measuring the command queue 220 includes measuring an expected energy expenditure for commands in the command queue. In an example, the expected energy expenditure is determined from an energy budget assigned to respective commands. In an example, the energy budget is a value that is modified by comparing a stored value for a command in the energy budget and an actual value of expended energy when the command is executed. In an example, measuring the expected energy expenditure for the commands includes measuring a rate of energy expenditure. Energy expenditure may provide a direct indication of additional heat to the device 205 by executing the commands. However, it is often more difficult to make energy expenditure determinations due to the increase record keeping (e.g., maintaining a command to energy expenditure mapping) and processing.

The controller 210 is arranged to modify operation of the device 205 based on the workload and the high-temperature thermal condition. In an example, modifying operation of the device 205 includes throttling a resource of the device 205. In an example, the high-temperature thermal condition is one of an ordered set of thermal conditions for the device 205. In an example, a higher order in the set of thermal conditions corresponds to a greater degree of throttling. Thus, the device 205 may progress through several high-temperature thermal conditions, each one being more severe and corresponding to more severe throttling to manage the problems associated with high temperatures. In an example, the throttling is non-linear to account for the non-linear detriment of extreme heat situations versus milder high-temperature conditions.

In an example, throttling the resource of the device 205 includes powering-off a component of the device 205. In an example, the component a die. In an example, the component is a bus. In an example, throttling the resource includes increasing a time between executing tasks of the workload. This type of throttling lowers the average energy expenditure over time, allowing more time for heat to dissipate.

In an example, modifying operation of the device 205 includes comparing the workload to a threshold and refraining from throttling a resource of the device 205 when the workload is within the threshold. Here, a temperature-only policy is overridden when the workload is small enough. This allows for the device 205 to offer higher performance with negligible thermal impact due to the small amount of work to perform. Often, in burst-oriented applications, this approach leads to better performance with little risk of data corruption.

In an example, a driver of a host device communicatively coupled to the device 205, when in operation, performs at least one of obtaining the indicator, measuring the workload, or modifying operation of the NAND device. This example notes that many of the controller 210 tasks described above may be performed by a host in, for example, an unmanaged device (e.g., a device that does not include the controller 210).

Figure 3:
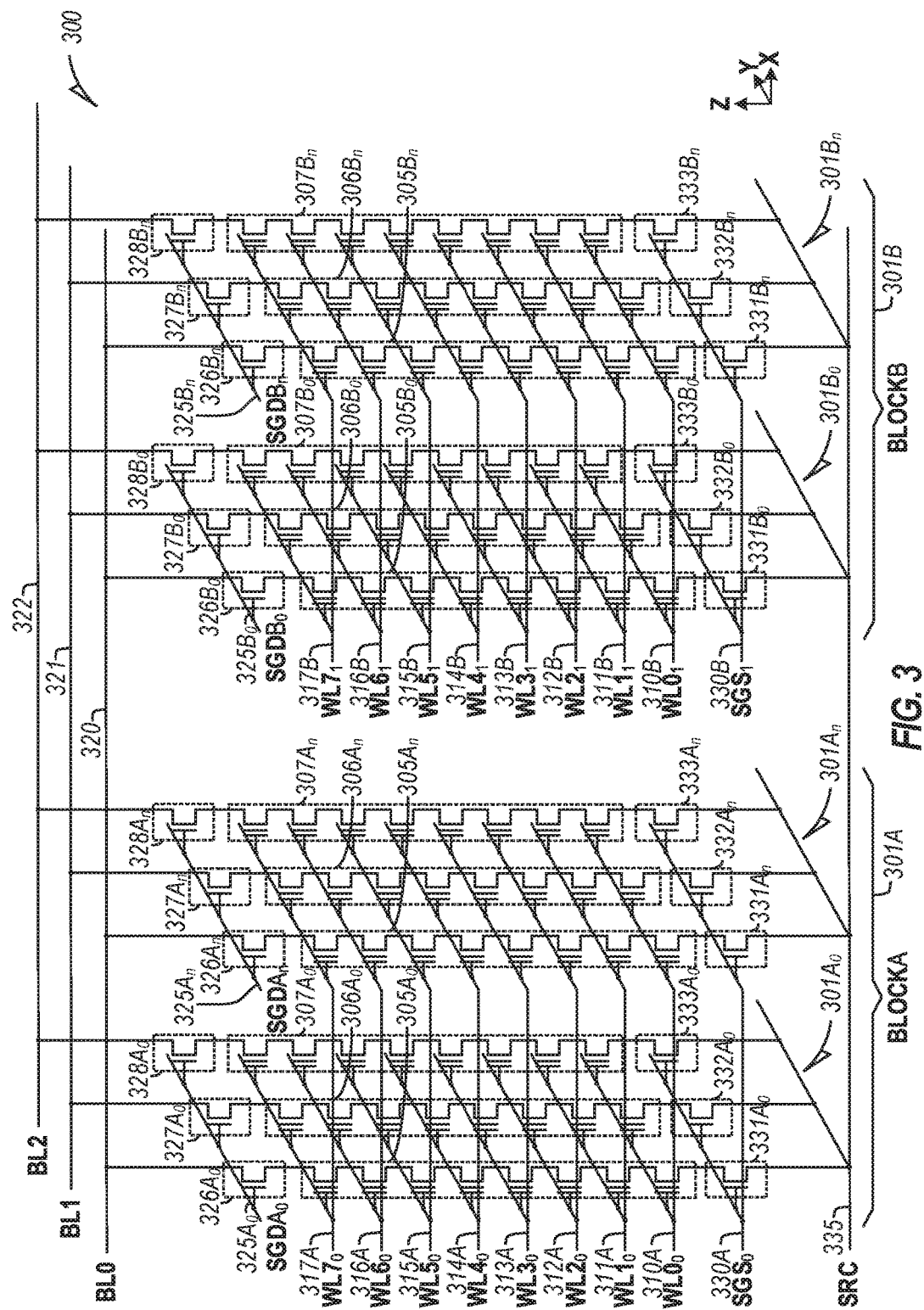
FIGS. 3-4 illustrate schematic diagrams of an example of a 3D NAND architecture semiconductor memory array.

FIG. 3 illustrates an example schematic diagram of a 3D NAND architecture semiconductor memory array 300 including a number of strings of memory cells (e.g., first-third $A_0$ memory strings $305A_0$-$307A_0$, first-third $A_n$ memory strings $305A_n$-$307A_n$, first-third $B_0$ memory strings $305B_0$-$307B_0$, first-third $B_n$ memory strings $305B_n$-$307B_n$, etc.), organized in blocks (e.g., block A 301A, block B 301B, etc.) and sub-blocks (e.g., sub-block $A_0$ 301$A_0$, sub-block $A_n$ 301$A_n$, sub-block $B_0$ 301$B_0$, sub-block $B_n$ 301$B_n$, etc.). The memory array 300 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 335 or a source-side select gate (SGS) (e.g., first-third $A_0$ SGS $331A_0$-$333A_0$, first-third $A_n$ SGS $331A_n$-$333A_n$, first-third $B_0$ SGS $331B_0$-$333B_0$, first-third $B_n$ SGS $331B_n$-$333B_n$, etc.) and a drain-side select gate (SGD) (e.g., first-third $A_0$ SGD $326A_0$-$328A_0$, first-third $A_n$ SGD $326A_n$-$328A_n$, first-third $B_0$ SGD $326B_0$-$328B_0$, first-third $B_n$ SGD $326B_n$-$328B_n$, etc.). Each string of memory cells in the 3D memory array can be arranged along the X direction as data lines (e.g., bit lines (BL) BL0-BL2 320-322), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 356, 384, etc.). Although illustrated herein as having two blocks, each block having two sub-blocks, each sub-block having a single physical page, each physical page having three strings of memory cells, and each string having 8 tiers of memory cells, in other examples, the memory array 300 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+3208 bytes), 1536 pages per block, 548 blocks per plane, and 4 or more planes per device.

Each memory cell in the memory array 300 includes a control gate (CG) coupled to (e.g., electrically or otherwise operatively connected to) an access line (e.g., word lines (WL) $WL0_0$-$WL7_0$ 310A-317A, $WL0_1$-$WL7_1$ 310B-317B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $326A_0$-$328A_0$ can be accessed using an $A_0$ SGD line $SGDA_0$ $325A_0$, first-third $A_n$ SGD $326A_n$-$328A_n$ can be accessed using an $A_n$ SGD line $SGDA_n$ $325A_n$, first-third $B_0$ SGD $326B_0$-$328B_0$ can be accessed using an $B_0$ SGD line $SGDB_0$ $325B_0$, and first-third $B_n$ SGD $326B_n$-$328B_n$ can be accessed using an $B_n$ SGD line $SGDB_n$ $325B_n$. First-third $A_0$ SGS $331A_0$-$333A_0$ and first-third $A_n$ SGS $331A_n$-$333A_n$ can be accessed using a gate select line $SGS_0$ 330A, and first-third $B_0$ SGS $331B_0$-$333B_0$ and first-third $B_n$ SGS $331B_n$-$333B_n$ can be accessed using a gate select line $SGS_1$ 330B.

In an example, the memory array 300 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 4:
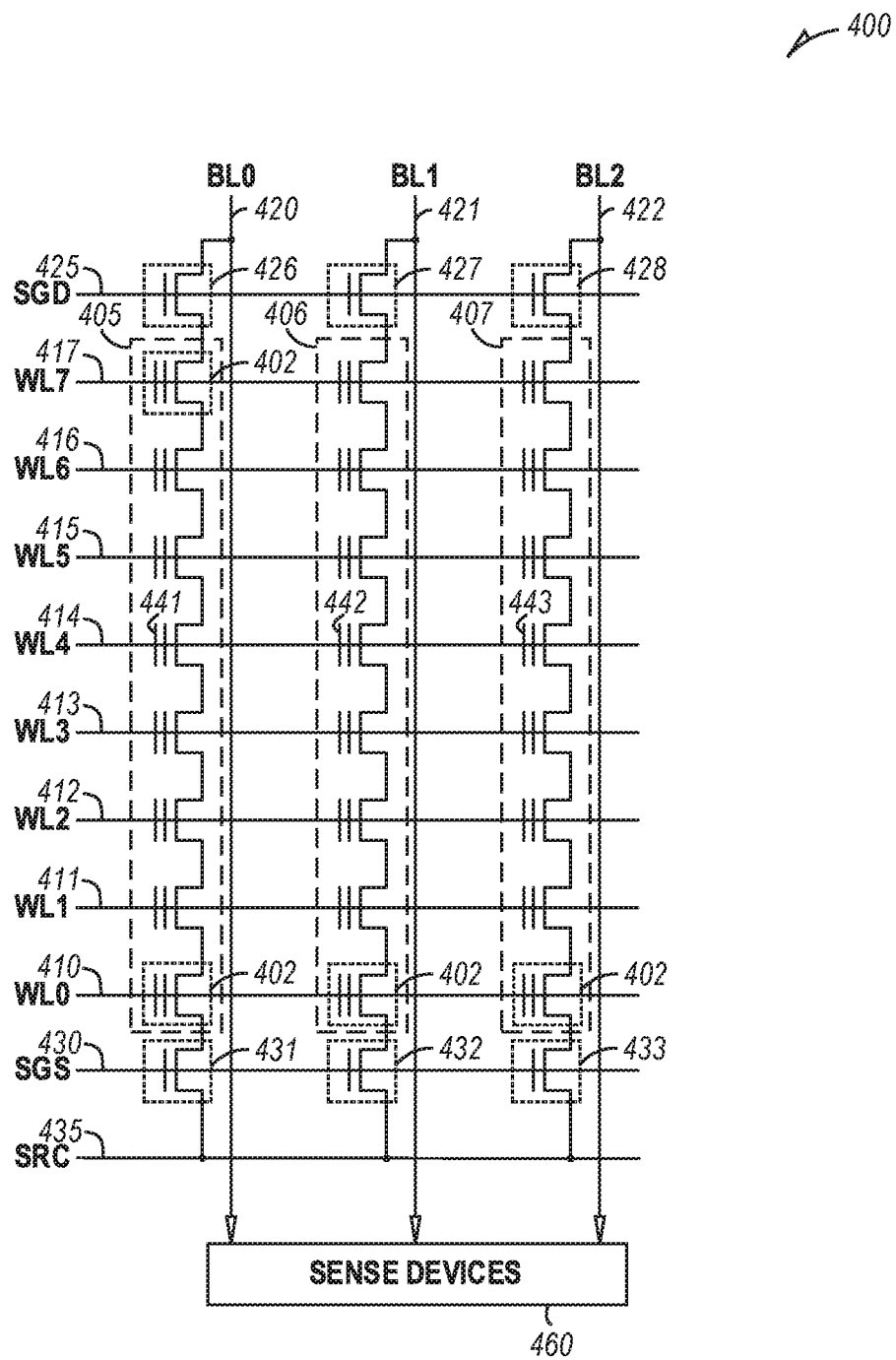

FIG. 4 illustrates an example schematic diagram of a portion of a NAND architecture semiconductor memory array 400 including a plurality of memory cells 402 arranged in a two-dimensional array of strings (e.g., first-third strings 405-407) and tiers (e.g., illustrated as respective word lines (WL) WL0-WL7 410-417, a drain-side select gate (SGD) line 425, a source-side select gate (SGS) line 430, etc.), and sense amplifiers or devices 460. For example, the memory array 400 can illustrate an example schematic diagram of a portion of one physical page of memory cells of a 3D NAND architecture semiconductor memory device, such as illustrated in FIG. 3.

Each string of memory cells is coupled to a source line (SRC) using a respective source-side select gate (SGS) (e.g., first-third SGS 431-433), and to a respective data line (e.g., first-third bit lines (BL) BL0-BL2 420-422) using a respective drain-side select gate (SGD) (e.g., first-third SGD 426-428). Although illustrated with 8 tiers (e.g., using word lines (WL) WL0-WL7 410-417) and three data lines (BL0-BL2 426-428) in the example of FIG. 4, other examples can include strings of memory cells having more or fewer tiers or data lines, as desired.

In a NAND architecture semiconductor memory array, such as the example memory array 400, the state of a selected memory cell 402 can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 441-443 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 460, coupled to one or more of the data lines (e.g., first, second, or third bit lines (BL0-BL2) 420-422), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
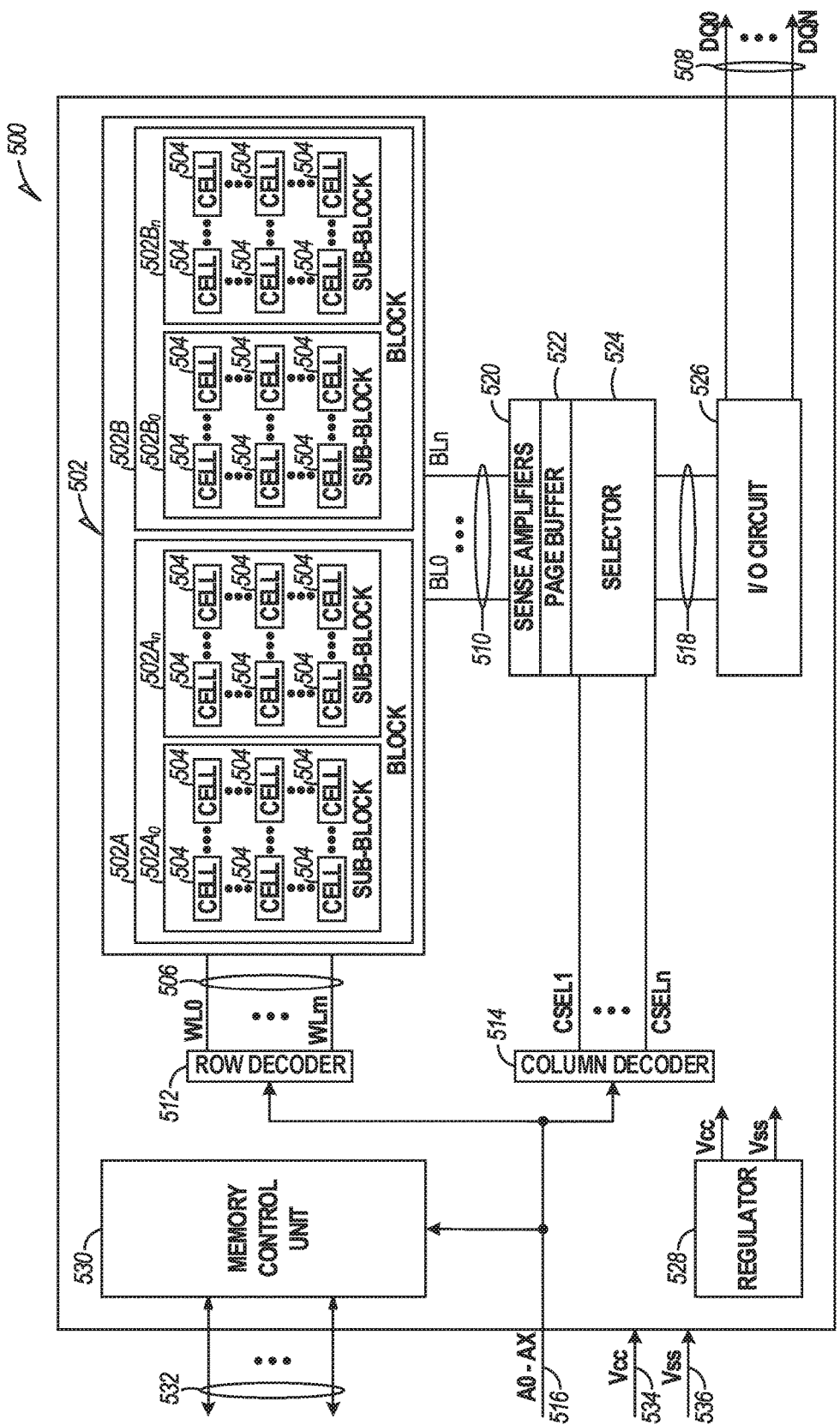
FIG. 5 illustrates an example block diagram of a memory module.

FIG. 5 illustrates an example block diagram of a memory device 500 including a memory array 502 having a plurality of memory cells 504, and one or more circuits or components to provide communication with, or perform one or more memory operations on, the memory array 502. The memory device 500 can include a row decoder 512, a column decoder 514, sense amplifiers 520, a page buffer 522, a selector 524, an input/output (I/O) circuit 526, and a memory control unit 530.

The memory cells 504 of the memory array 502 can be arranged in blocks, such as first and second blocks 502A, 502B. Each block can include sub-blocks. For example, the first block 502A can include first and second sub-blocks 502A$_0$, 502A$_n$, and the second block 502B can include first and second sub-blocks 502B$_0$, 502B$_n$. Each sub-block can include a number of physical pages, each page including a number of memory cells 504. Although illustrated herein as having two blocks, each block having two sub-blocks, and each sub-block having a number of memory cells 504, in other examples, the memory array 502 can include more or fewer blocks, sub-blocks, memory cells, etc. In other examples, the memory cells 504 can be arranged in a number of rows, columns, pages, sub-blocks, blocks, etc., and accessed using, for example, access lines 506, first data lines 510, or one or more select gates, source lines, etc.

The memory control unit 530 can control memory operations of the memory device 500 according to one or more signals or instructions received on control lines 532, including, for example, one or more clock signals or control signals that indicate a desired operation (e.g., write, read, erase, etc.), or address signals (A0-AX) received on one or more address lines 516. One or more devices external to the memory device 500 can control the values of the control signals on the control lines 532, or the address signals on the address line 516. Examples of devices external to the memory device 500 can include, but are not limited to, a host, a memory controller, a processor, or one or more circuits or components not illustrated in FIG. 5.

The memory device 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The memory device 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the memory device 500 can communicate with the memory device 500 using the I/O lines (DQ0-DQN) 508, address lines 516 (A0-AX), or control lines 532. The input/output (I/O) circuit 526 can transfer values of data in or out of the memory device 500, such as in or out of the page buffer 522 or the memory array 502, using the I/O lines 508, according to, for example, the control lines 532 and address lines 516. The page buffer 522 can store data received from the one or more devices external to the memory device 500 before the data is programmed into relevant portions of the memory array 502, or can store data read from the memory array 502 before the data is transmitted to the one or more devices external to the memory device 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory control unit 530 can include a regulator 528 to internally provide positive or negative supply signals.

Figure 6:
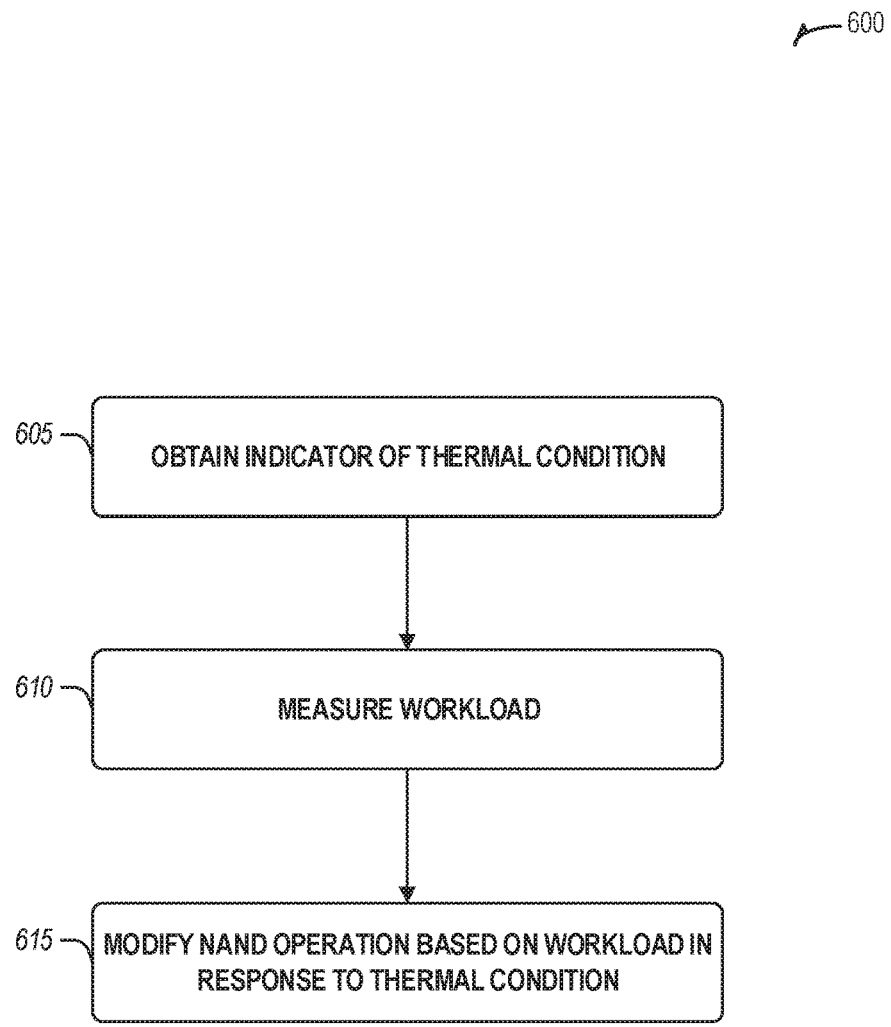
FIG. 6 illustrates an example flowchart of a method for increased NAND performance under high-thermal conditions.

FIG. 6 illustrates an example flowchart of a method 600 for increased NAND performance under high-thermal conditions. Operations of the method 600 are performed by hardware, such as that described above with respect to FIGS. 1-5, or below with respect to FIG. 7 (e.g., processing circuitry).

At operation 605, an indicator of a high-temperature thermal condition for a NAND device is obtained.

At operation 610, a workload of the NAND device is measured in response to the high-temperature thermal condition. In an example, measuring the workload includes periodically evaluating the workload during the high-temperature thermal condition.

In an example, measuring the workload includes measuring a command queue. In an example, measuring the command queue includes measuring rate of commands over time. In an example, measuring the command queue includes measuring an expected energy expenditure for commands in the command queue. In an example, the expected energy expenditure is determined from an energy budget assigned to respective commands. In an example, the energy budget is a value that is modified by comparing a stored value for a command in the energy budget and an actual value of expended energy when the command is executed. In an example, measuring the expected energy expenditure for the commands includes measuring a rate of energy expenditure.

At operation 615, operation of the NAND device is modified based on the workload and the high-temperature thermal condition. In an example, modifying operation of the NAND device includes throttling a resource of the NAND device. In an example, the high-temperature thermal condition is one of an ordered set of thermal conditions for the NAND device. In an example, a higher order in the set of thermal conditions corresponds to a greater degree of throttling. In an example, the throttling the resource of the NAND device includes powering-off a component of the NAND device. In an example, the component of the NAND device is a die. In an example, throttling the resource includes increasing a time between executing tasks of the workload. In an example, modifying operation of the NAND device based on the workload and the high-temperature thermal condition includes comparing the workload to a threshold and refraining from throttling a resource of the NAND device when the workload is within the threshold.

In an example, the NAND device includes a controller. In an example, the operations of the method 600 of obtaining the indicator, measuring the workload, and modifying operation of the NAND device are performed by the controller. In an example, a driver of a host device communicatively coupled to the NAND device when in operation performs at least one of the operations of obtaining the indicator, measuring the workload, or modifying operation of the NAND device.

Figure 7:
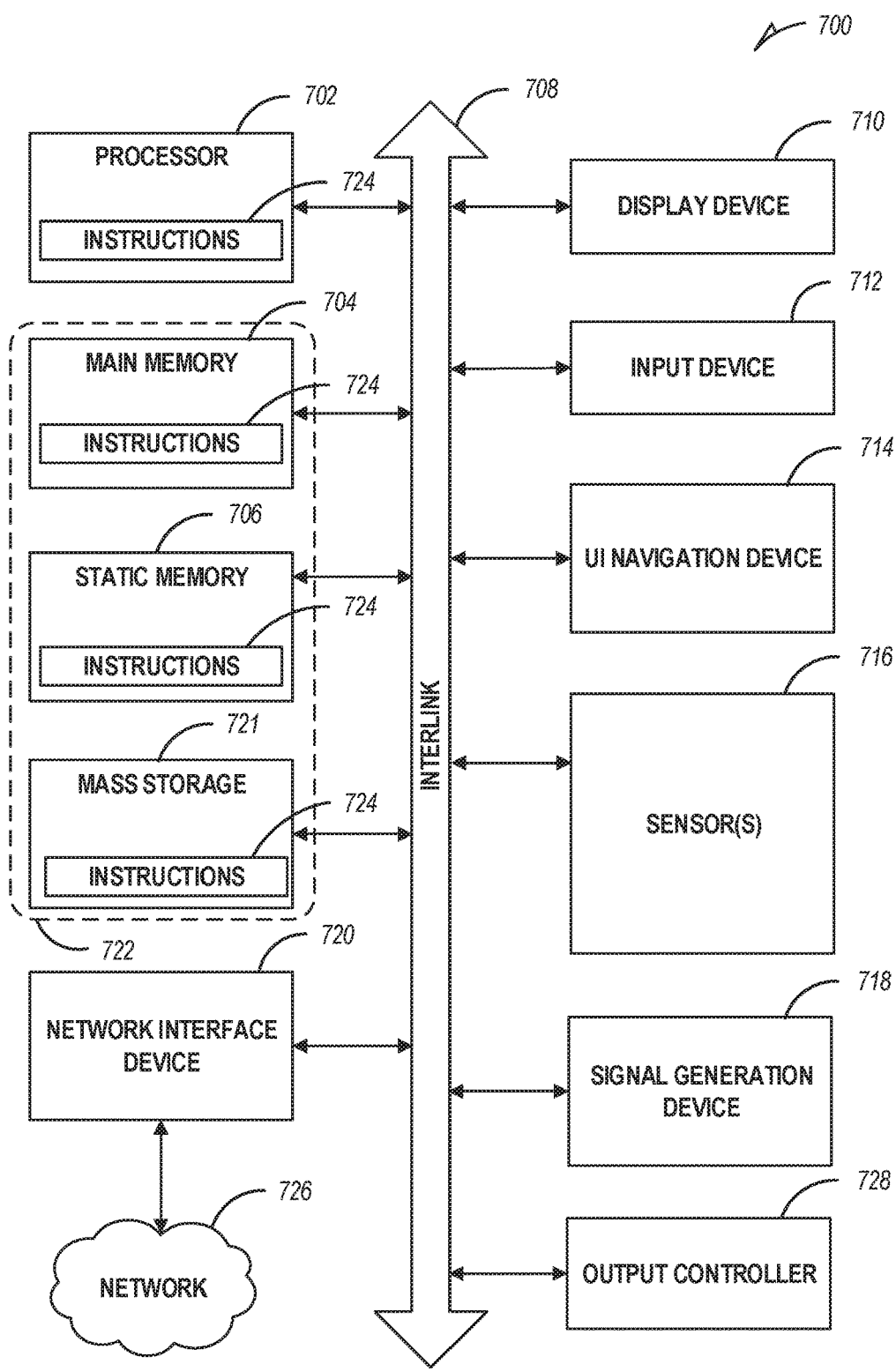
FIG. 7 is a block diagram illustrating an example of a machine upon which one or more embodiments may be implemented.

FIG. 7 illustrates a block diagram of an example machine 700 upon which any one or more of the techniques (e.g., methodologies) discussed herein may perform. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 700 (e.g., the host device 105, the memory device 110, etc.) may include a hardware processor 702 (e.g., a central processing unit (CPU), a graphics processing unit (GPU), a hardware processor core, or any combination thereof, such as the memory controller 115, etc.), a main memory 704 and a static memory 706, some or all of which may communicate with each other via an interlink (e.g., bus) 708. The machine 700 may further include a display unit 710, an alphanumeric input device 712 (e.g., a keyboard), and a user interface (UI) navigation device 714 (e.g., a mouse). In an example, the display unit 710, input device 712 and UI navigation device 714 may be a touch screen display. The machine 700 may additionally include a storage device (e.g., drive unit) 716, a signal generation device 718 (e.g., a speaker), a network interface device 720, and one or more sensors 716, such as a global positioning system (GPS) sensor, compass, accelerometer, or other sensor. The machine 700 may include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 716 may include a machine readable medium 722 on which is stored one or more sets of data structures or instructions 724 (e.g., software) embodying or utilized by any one or more of the techniques or functions described herein. The instructions 724 may also reside, completely or at least partially, within the main memory 704, within static memory 706, or within the hardware processor 702 during execution thereof by the machine 700. In an example, one or any combination of the hardware processor 702, the main memory 704, the static memory 706, or the storage device 716 may constitute the machine readable medium 722.

While the machine readable medium 722 is illustrated as a single medium, the term "machine readable medium" may include a single medium or multiple media (e.g., a centralized or distributed database, or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 (e.g., software, programs, an operating system (OS), etc.) or other data are stored on the storage device 721, can be accessed by the memory 704 for use by the processor 702. The memory 704 (e.g., DRAM) is typically fast, but volatile, and thus a different type of storage than the storage device 721 (e.g., an SSD), which is suitable for long-term storage, including while in an "off" condition. The instructions 724 or data in use by a user or the machine 700 are typically loaded in the memory 704 for use by the processor 702. When the memory 704 is full, virtual space from the storage device 721 can be allocated to supplement the memory 704; however, because the storage 721 device is typically slower than the memory 704, and write speeds are typically at least twice as slow as read speeds, use of virtual memory can greatly reduce user experience due to storage device latency (in contrast to the memory 704, e.g., DRAM). Further, use of the storage device 721 for virtual memory can greatly reduce the usable lifespan of the storage device 721.

In contrast to virtual memory, virtual memory compression (e.g., the Linux® kernel feature "ZRAM") uses part of the memory as compressed block storage to avoid paging to the storage device 721. Paging takes place in the compressed block until it is necessary to write such data to the storage device 721. Virtual memory compression increases the usable size of memory 704, while reducing wear on the storage device 721.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 724 may further be transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi, IEEE 802.16 family of standards known as WiMax®), IEEE 802.15.4 family of standards, peer-to-peer (P2P) networks, among others. In an example, the network interface device 720 may include one or more physical jacks (e.g., Ethernet, coaxial, or phone jacks) or one or more antennas to connect to the communications network 726. In an example, the network interface device 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

Additional Examples

Example 1 is a system for increased NAND performance under high thermal conditions, the system comprising: processing circuitry to: obtain an indicator of a high-temperature thermal condition for a NAND device; measure a workload of the NAND device in response to the high-temperature thermal condition; and modify operation of the NAND device based on the workload and the high-temperature thermal condition.

In Example 2, the subject matter of Example 1 includes, wherein, to modify operation of the NAND device, the processing circuitry throttles a resource of the NAND device.

In Example 3, the subject matter of Example 2 includes, wherein the high-temperature thermal condition is one of an ordered set of thermal conditions for the NAND device, and wherein a higher order in the set of thermal conditions corresponds to a greater degree of throttling.

In Example 4, the subject matter of Examples 2-3 includes, wherein, to throttle the resource of the NAND device, the processing circuitry powers-off a component of the NAND device.

In Example 5, the subject matter of Example 4 includes, wherein the component of the NAND device is a die.

In Example 6, the subject matter of Examples 2-5 includes, wherein, to throttle the resource, the processing circuitry increases a time between executing tasks of the workload.

In Example 7, the subject matter of Examples 2-6 includes, wherein, to modify operation of the NAND device based on the workload and the high-temperature thermal condition, the processing circuitry compares the workload to a threshold and refrains from throttling a resource of the NAND device when the workload is within the threshold.

In Example 8, the subject matter of Examples 1-7 includes, wherein, to measure the workload, the processing circuitry periodically evaluates the workload during the high-temperature thermal condition.

In Example 9, the subject matter of Examples 1-8 includes, wherein, to measure the workload, the processing circuitry measures a command queue.

In Example 10, the subject matter of Example 9 includes, wherein, to measure the command queue, the processing circuitry measures a rate of commands over time.

In Example 11, the subject matter of Examples 9-10 includes, wherein, to measure the command queue, the processing circuitry measures an expected energy expenditure for commands in the command queue, the expected energy expenditure determined from an energy budget assigned to respective commands.

In Example 12, the subject matter of Example 11 includes, wherein the energy budget is a value that is modified by comparison of a stored value for a command in the energy budget and an actual value of expended energy when the command is executed.

In Example 13, the subject matter of Examples 11-12 includes, wherein, to measure the expected energy expenditure for the commands, the processing circuitry measures a rate of energy expenditure.

In Example 14, the subject matter of Examples 1-13 includes, wherein the NAND device includes a controller, and wherein the processing circuitry is wholly contained within the controller the controller.

In Example 15, the subject matter of Examples 1-14 includes, wherein a portion of the processing circuitry implements a driver of a host device communicatively coupled to the NAND device when in operation, and wherein the driver directs the processing circuitry to at least one of obtain the indicator, measure the workload, or modify operation of the NAND device.

Example 16 is a method for increased NAND performance under high thermal conditions, the method comprising: obtaining an indicator of a high-temperature thermal condition for a NAND device; measuring a workload of the NAND device in response to the high-temperature thermal condition; and modifying operation of the NAND device based on the workload and the high-temperature thermal condition.

In Example 17, the subject matter of Example 16 includes, wherein modifying operation of the NAND device includes throttling a resource of the NAND device.

In Example 18, the subject matter of Example 17 includes, wherein the high-temperature thermal condition is one of an ordered set of thermal conditions for the NAND device, and wherein a higher order in the set of thermal conditions corresponds to a greater degree of throttling.

In Example 19, the subject matter of Examples 17-18 includes, wherein the throttling the resource of the NAND device includes powering-off a component of the NAND device.

In Example 20, the subject matter of Example 19 includes, wherein the component of the NAND device is a die.

In Example 21, the subject matter of Examples 17-20 includes, wherein throttling the resource includes increasing a time between executing tasks of the workload.

In Example 22, the subject matter of Examples 17-21 includes, wherein modifying operation of the NAND device based on the workload and the high-temperature thermal condition includes comparing the workload to a threshold and refraining from throttling a resource of the NAND device when the workload is within the threshold.

In Example 23, the subject matter of Examples 16-22 includes, wherein measuring the workload includes periodically evaluating the workload during the high-temperature thermal condition.

In Example 24, the subject matter of Examples 16-23 includes, wherein measuring the workload includes measuring a command queue.

In Example 25, the subject matter of Example 24 includes, wherein measuring the command queue includes measuring rate of commands over time.

In Example 26, the subject matter of Examples 24-25 includes, wherein measuring the command queue includes measuring an expected energy expenditure for commands in the command queue, the expected energy expenditure determined from an energy budget assigned to respective commands.

In Example 27, the subject matter of Example 26 includes, wherein the energy budget is a value that is modified by comparing a stored value for a command in the energy budget and an actual value of expended energy when the command is executed.

In Example 28, the subject matter of Examples 26-27 includes, wherein measuring the expected energy expenditure for the commands includes measuring a rate of energy expenditure.

In Example 29, the subject matter of Examples 16-28 includes, wherein the NAND device includes a controller, and wherein the operations of obtaining the indicator, measuring the workload, and modifying operation of the NAND device are performed by the controller.

In Example 30, the subject matter of Examples 16-29 includes, wherein a driver of a host device communicatively coupled to the NAND device when in operation performs at least one of the operations of obtaining the indicator, measuring the workload, or modifying operation of the NAND device.

Example 31 is at least one machine readable medium including instructions that, when executed by processing circuitry, cause the processing circuitry to perform any method of Examples 16-30.

Example 32 is a system comprising means to perform any method of Examples 16-30.

Example 33 is at least one machine readable medium including instructions that, when executed by processing circuitry, cause the processing circuitry to perform operations comprising: obtaining an indicator of a high-temperature thermal condition for a NAND device; measuring a workload of the NAND device in response to the high-temperature thermal condition; and modifying operation of the NAND device based on the workload and the high-temperature thermal condition.

In Example 34, the subject matter of Example 33 includes, wherein modifying operation of the NAND device includes throttling a resource of the NAND device.

In Example 35, the subject matter of Example 34 includes, wherein the high-temperature thermal condition is one of an ordered set of thermal conditions for the NAND device, and wherein a higher order in the set of thermal conditions corresponds to a greater degree of throttling.

In Example 36, the subject matter of Examples 34-35 includes, wherein the throttling the resource of the NAND device includes powering-off a component of the NAND device.

In Example 37, the subject matter of Example 36 includes, wherein the component of the NAND device is a die.

In Example 38, the subject matter of Examples 34-37 includes, wherein throttling the resource includes increasing a time between executing tasks of the workload.

In Example 39, the subject matter of Examples 34-38 includes, wherein modifying operation of the NAND device based on the workload and the high-temperature thermal condition includes comparing the workload to a threshold and refraining from throttling a resource of the NAND device when the workload is within the threshold.

In Example 40, the subject matter of Examples 33-39 includes, wherein measuring the workload includes periodically evaluating the workload during the high-temperature thermal condition.

In Example 41, the subject matter of Examples 33-40 includes, wherein measuring the workload includes measuring a command queue.

In Example 42, the subject matter of Example 41 includes, wherein measuring the command queue includes measuring rate of commands over time.

In Example 43, the subject matter of Examples 41-42 includes, wherein measuring the command queue includes measuring an expected energy expenditure for commands in the command queue, the expected energy expenditure determined from an energy budget assigned to respective commands.

In Example 44, the subject matter of Example 43 includes, wherein the energy budget is a value that is modified by comparing a stored value for a command in the energy budget and an actual value of expended energy when the command is executed.

In Example 45, the subject matter of Examples 43-44 includes, wherein measuring the expected energy expenditure for the commands includes measuring a rate of energy expenditure.

In Example 46, the subject matter of Examples 33-45 includes, wherein the NAND device includes a controller, and wherein the operations of obtaining the indicator, measuring the workload, and modifying operation of the NAND device are performed by the controller.

In Example 47, the subject matter of Examples 33-46 includes, wherein a driver of a host device communicatively coupled to the NAND device when in operation performs at least one of the operations of obtaining the indicator, measuring the workload, or modifying operation of the NAND device.

Example 48 is a system for increased NAND performance under high thermal conditions, the system comprising: means for obtaining an indicator of a high-temperature thermal condition for a NAND device; means for measuring a workload of the NAND device in response to the high-temperature thermal condition; and means for modifying operation of the NAND device based on the workload and the high-temperature thermal condition.

In Example 49, the subject matter of Example 48 includes, wherein the means for modifying operation of the NAND device include means for throttling a resource of the NAND device.

In Example 50, the subject matter of Example 49 includes, wherein the high-temperature thermal condition is one of an ordered set of thermal conditions for the NAND device, and wherein a higher order in the set of thermal conditions corresponds to a greater degree of throttling.

In Example 51, the subject matter of Examples 49-50 includes, wherein the means for throttling the resource of the NAND device include means for powering-off a component of the NAND device.

In Example 52, the subject matter of Example 51 includes, wherein the component of the NAND device is a die.

In Example 53, the subject matter of Examples 49-52 includes, wherein the means for throttling the resource include means for increasing a time between executing tasks of the workload.

In Example 54, the subject matter of Examples 49-53 includes, wherein the means for modifying operation of the NAND device based on the workload and the high-temperature thermal condition include means for comparing the workload to a threshold and refraining from throttling a resource of the NAND device when the workload is within the threshold.

In Example 55, the subject matter of Examples 48-54 includes, wherein the means for measuring the workload include means for periodically evaluating the workload during the high-temperature thermal condition.

In Example 56, the subject matter of Examples 48-55 includes, wherein the means for measuring the workload include means for measuring a command queue.

In Example 57, the subject matter of Example 56 includes, wherein the means for measuring the command queue include means for measuring rate of commands over time.

In Example 58, the subject matter of Examples 56-57 includes, wherein the means for measuring the command queue include means for measuring an expected energy expenditure for commands in the command queue, the expected energy expenditure determined from an energy budget assigned to respective commands.

In Example 59, the subject matter of Example 58 includes, wherein the energy budget is a value that is modified by comparing a stored value for a command in the energy budget and an actual value of expended energy when the command is executed.

In Example 60, the subject matter of Examples 58-59 includes, wherein the means for measuring the expected energy expenditure for the commands include means for measuring a rate of energy expenditure.

In Example 61, the subject matter of Examples 48-60 includes, wherein the NAND device includes a controller, and wherein the means for obtaining the indicator, measuring the workload, and modifying operation of the NAND device are performed by the controller.

In Example 62, the subject matter of Examples 48-61 includes, wherein a driver of a host device communicatively coupled to the NAND device when in operation performs at least one of the means for obtaining the indicator, measuring the workload, or modifying operation of the NAND device.

Example 63 is at least one machine-readable medium including instructions that, when executed by processing circuitry, cause the processing circuitry to perform operations to implement of any of Examples 1-62.

Example 64 is an apparatus comprising means to implement of any of Examples 1-62.

Example 65 is a system to implement of any of Examples 1-62.

Example 66 is a method to implement of any of Examples 1-62.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system for increased NAND performance under high thermal conditions, the system comprising processing circuitry to:
    obtain an indicator of a high-temperature thermal condition for a NAND device;
    measure a workload of the NAND device in response to the high-temperature thermal condition, wherein, to measure the workload, a command queue is measured by expected energy expenditures for commands in the command queue, the expected energy expenditure determined from an energy budget assigned to respective commands; and
    modify operation of the NAND device based on the workload and the high-temperature thermal condition.

2. The system of claim 1, wherein, to modify operation of the NAND device, the processing circuitry throttles a resource of the NAND device.

3. The system of claim 2, wherein, to throttle the resource of the NAND device, the processing circuitry powers-off a component of the NAND device.

4. The system of claim 3, wherein the component of the NAND device is a die.

5. The system of claim 2, wherein, to modify operation of the NAND device based on the workload and the high-temperature thermal condition, the processing circuitry compares the workload to a threshold and refrains from throttling a resource of the NAND device when the workload is within the threshold.

6. The system of claim 1, wherein, to measure the command queue, the processing circuitry measures a rate of commands over time.

7. The system of claim 1, wherein the energy budget is a value that is modified by comparison of a stored value for a command in the energy budget and an actual value of expended energy when the command is executed.

8. The system of claim 1, wherein, to measure the expected energy expenditure for the commands, the processing circuitry measures a rate of energy expenditure.

9. A method for increased NAND performance under high thermal conditions, the method comprising:
    obtaining an indicator of a high-temperature thermal condition for a NAND device;
    measuring a workload of the NAND device in response to the high-temperature thermal condition, the measuring including measuring a command queue by measuring an expected energy expenditure for commands in the command queue, the expected energy expenditure determined from an energy budget assigned to respective commands; and
    modifying operation of the NAND device based on the workload and the high-temperature thermal condition.

10. The method of claim 9, wherein modifying operation of the NAND device includes throttling a resource of the NAND device.

11. The method of claim 10, wherein the throttling the resource of the NAND device includes powering-off a component of the NAND device.

12. The method of claim 11, wherein the component of the NAND device is a die.

13. The method of claim 10, wherein modifying operation of the NAND device based on the workload and the high-temperature thermal condition includes comparing the workload to a threshold and refraining from throttling a resource of the NAND device when the workload is within the threshold.

14. The method of claim 9, wherein measuring the command queue includes measuring rate of commands over time.

15. The method of claim 9, wherein the energy budget is a value that is modified by comparing a stored value for a command in the energy budget and an actual value of expended energy when the command is executed.

16. The method of claim 9, wherein measuring the expected energy expenditure for the commands includes measuring a rate of energy expenditure.

17. At least one machine readable medium including instructions that, when executed by processing circuitry, cause the processing circuitry to perform operations comprising:
    obtaining an indicator of a high-temperature thermal condition for a NAND device;
    measuring a workload of the NAND device in response to the high-temperature thermal condition, the measuring including measuring a command queue by measuring an expected energy expenditure for commands in the command queue, the expected energy expenditure determined from an energy budget assigned to respective commands; and modifying operation of the NAND device based on the workload and the high-temperature thermal condition.

18. The machine readable medium of claim 17, wherein modifying operation of the NAND device includes throttling a resource of the NAND device.

19. The machine readable medium of claim 18, wherein the throttling the resource of the NAND device includes powering-off a component of the NAND device.

20. The machine readable medium of claim 19, wherein the component of the NAND device is a die.

21. The machine readable medium of claim 18, wherein modifying operation of the NAND device based on the workload and the high-temperature thermal condition includes comparing the workload to a threshold and refraining from throttling a resource of the NAND device when the workload is within the threshold.

22. The machine readable medium of claim 17, wherein measuring the command queue includes measuring rate of commands over time.

23. The machine readable medium of claim 17, wherein the energy budget is a value that is modified by comparing a stored value for a command in the energy budget and an actual value of expended energy when the command is executed.

24. The machine readable medium of claim 17, wherein measuring the expected energy expenditure for the commands includes measuring a rate of energy expenditure.

25. The system of claim 1, wherein the NAND device includes a controller, and wherein the processing circuitry is wholly contained within the controller.

26. The system of claim 1, wherein the high-temperature thermal condition is one of an ordered set of thermal conditions for the NAND device, and wherein a higher order in the set of thermal conditions corresponds to a greater degree of throttling.

27. The method of claim 9, wherein the NAND device includes a controller, and wherein the operations of obtaining the indicator, measuring the workload, and modifying operation of the NAND device are performed by the controller.

28. The method of claim 9, wherein the high-temperature thermal condition is one of an ordered set of thermal conditions for the NAND device, and wherein a higher order in the set of thermal conditions corresponds to a greater degree of throttling.

29. The machine readable medium of claim 14, wherein the NAND device includes a controller, and wherein the operations of obtaining the indicator, measuring the workload, and modifying operation of the NAND device are performed by the controller.

30. The machine readable medium of claim 14, wherein the high-temperature thermal condition is one of an ordered set of thermal conditions for the NAND device, and wherein a higher order in the set of thermal conditions corresponds to a greater degree of throttling.

* * * * *